United States Patent [19]
Liu et al.

[11] Patent Number: 4,588,928
[45] Date of Patent: May 13, 1986

[54] ELECTRON EMISSION SYSTEM

[75] Inventors: Ruichen Liu; Michael G. R. Thomson, both of Berkeley Heights, N.J.

[73] Assignee: AT&T Bell Laboratories, Murray Hill, N.J.

[21] Appl. No.: 504,671

[22] Filed: Jun. 15, 1983

[51] Int. Cl.$^4$ .............................................. H01J 29/58
[52] U.S. Cl. ............................. 315/382; 250/396 ML
[58] Field of Search ................ 250/396 ML; 313/336, 313/341, 311, 346 R; 315/382, 14, 111.81

[56] References Cited

U.S. PATENT DOCUMENTS

| | | | |
|---|---|---|---|
| 3,374,386 | 3/1968 | Charbonnier et al. | 313/34.6 |
| 3,814,975 | 6/1974 | Wolfe et al. | 313/336 |
| 4,075,533 | 2/1978 | Janko | 315/382 |
| 4,324,999 | 4/1982 | Wolfe | 313/346 |
| 4,426,582 | 1/1984 | Orloff et al. | 250/396 |

OTHER PUBLICATIONS

L. W. Swanson et al., "Field Electron Cathode Stability Studies: Zirconium/Tungsten Thermal-Field Cathode", *Journal of Applied Physics*, vol. 46, No. 5, May, 1975, pp. 2029–2050.

*Primary Examiner*—Theodore M. Blum
*Assistant Examiner*—David Cain
*Attorney, Agent, or Firm*—Lucian C. Canepa

[57] ABSTRACT

An electron emission system includes a high-brightness field-emitter cathode. Advantageously, the tip of the cathode is shaped to minimize structural variations caused by surface tension forces. In addition, an electrode assembly associated with the cathode is designed to establish electric field forces that are opposite and at least approximately equal to the surface tension forces acting on the tip. The electric field forces can be adjusted to establish a highly stable operating condition without altering the value of electron beam energy for which the overall system was designed. Moreover, the current density of the beam at a writing surface can be selectively varied without changing prescribed operating parameters of the cathode. The resulting system is characterized by excellent emission stability, low noise and a useful operating life of at least several thousand hours.

25 Claims, 2 Drawing Figures

ELECTRON EMISSION SYSTEM

BACKGROUND OF THE INVENTION

This invention relates to an electron emission system and, more particularly, to such a system that includes a high-brightness electron source of the field-emitter type.

In a variety of applications of practical importance, the need exists for a stable high-brightness source of electrons. These applications include, for example, electron beam exposure systems of the type utilized in the fabrication of integrated circuits. Early versions of these systems employed thermionic thoriated-tungsten electron sources. More recently, as the need arose for still-higher-brightness electron sources, thermionic emitters made of lanthanum hexaboride ($LaB_6$) have been proposed. Typical emitters made of $LaB_6$ are generally at least about four times brighter than thoriated-tungsten sources.

But, in the course of designing a new generation of very-high-speed electron beam exposure systems, it became apparent that even $LaB_6$ sources would not satisfy the electron emission requirements of such equipment. What was needed was a source capable of a brightness about one hundred times that of a thoriated-tungsten source. And, although it was known that very-high-brightness electron sources of the field-emitter type were available, the operating characteristics of such known sources did not meet the stringent emission stability requirements of a highly reliable electron beam exposure system suitable for commercial use.

Accordingly, efforts have been directed at trying to improve the operation of a field-emitter electron source and of an overall system including such a source. It was recognized that such efforts, if successful, could provide an important basis for a successful commercial design of electron emission equipment such as a very-high-speed electron beam exposure system. In turn, the availability of such a system would lower the cost of fabricating very-large-scale integrated circuit devices.

SUMMARY OF THE INVENTION

Hence, an object of the present invention is an improved electron emission system. More specifically, an object of this invention is a system that comprises a reliable high-brightness emission-stable electron source of the field-emitter type. Another object of this invention is such a system in which the electrostatic field forces acting on the source can be adjusted to establish a highly stable operating condition without altering the value of electron beam energy for which the overall system was designed. Still another object of the invention is an electron beam system, including a high-reliability electron source, in which the current density of the beam at a writing surface can be selectively varied without changing prescribed operating parameters of the source.

Briefly, these and other objects of the present invention are realized in a specific illustrative electron emission system that includes a field-emitter cathode whose tip is shaped to minimize structural variations caused by surface tension forces. In addition, an electrode assembly, including a two-anode configuration, associated with the cathode is designed to establish electric field forces that are opposite and at least approximately equal to the surface tension forces acting on the tip.

More specifically, the illustrative system comprises a single-crystal element having a main longitudinal axis perpendicular to the (100) plane of the element. The element includes a pointed end from which electrons are emitted. The other end of the element is affixed to a support member. In particular, the pointed end comprises, in order from the emissive tip thereof to the support member: a generally hemispherical end portion having a centrally located (100) flat emissive region, a cylindrical portion, a tapered portion and a main shank portion extending to the support member. As a result, changes in the shape of the pointed end due to surface tension forces are thereby minimized.

In addition, an electrode assembly associated with the emissive element is designed to establish with respect to the end portion of the element electrostatic forces that are opposite and at least approximately equal to the surface tension forces acting on the end portion. The electrode assembly includes a two-anode configuration by means of which the electrostatic forces acting on the end portion of the element can be adjusted to establish a stable operating condition without altering the predesigned beam-energy characteristic of the system. At the same time, the system includes lenses that permit the dosage of the beam (that is, the current density of the beam at the writing plane) to be varied without disturbing the electrostatic forces acting on the end of the emissive element.

BRIEF DESCRIPTION OF THE DRAWING

A complete understanding of the present invention and of the above and other features thereof may be gained from a consideration of the following detailed description presented hereinbelow in connection with the accompanying drawing, not drawn to scale, in which.

DETAILED DESCRIPTION

Figure 1:
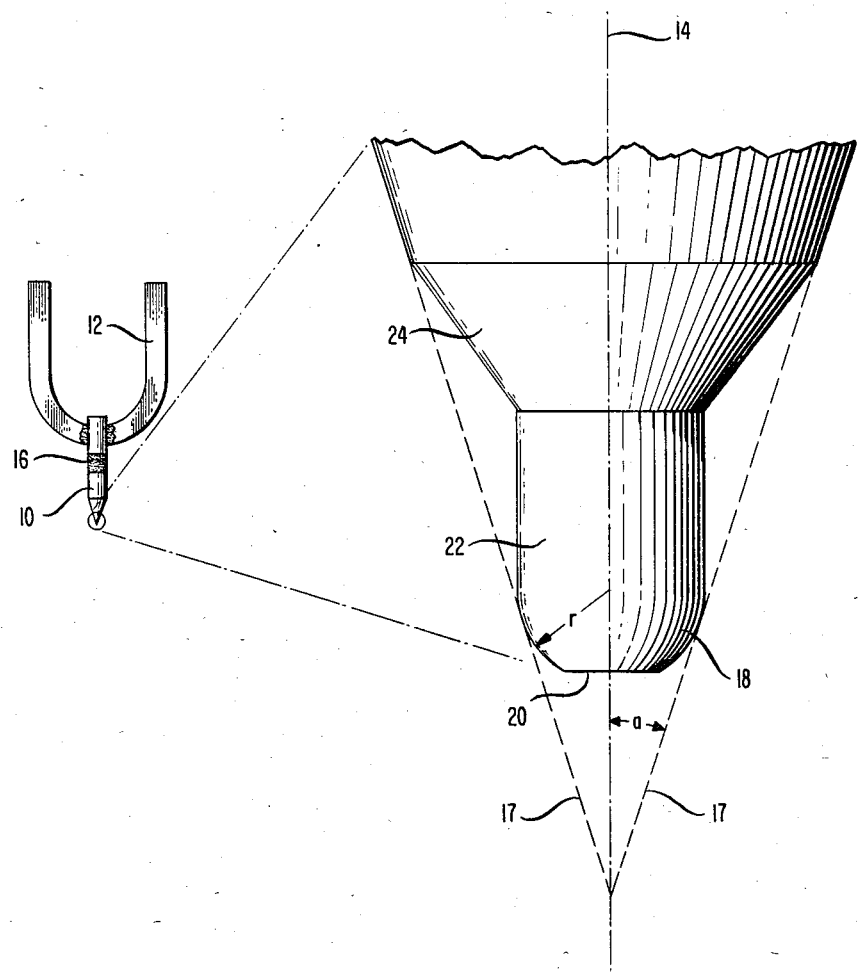
FIG. 1 shows a specific illustrative emissive element made in accordance with the principles of the present invention.

The specific illustrative cathode depicted in FIG. 1 comprises a single-crystal rod element 10. One end of the element 10 is attached to a support member 12. An enlarged view of the emissive tip of the element 10 is shown in FIG. 1.

By way of example, the element 10 of FIG. 1 comprises a single crystalline rod of tungsten whose main longitudinal axis 14 is perpendicular to the (100) plane of the element. In accordance with known etching procedures, the rod is etched to form an element having the unique tip shown in the enlarged view of FIG. 1.

Illustratively, the support member 12 shown in FIG. 1 comprises a so-called hairpin or U-shaped wire also made of tungsten. The member provides mechanical support for the element 10. In addition, the member 12 is utilized as a filament through which a constant d-c current is caused to flow. In that way, the cathode element 10 is in practice operated at a relatively high temperature, for example at a temperature in the range of about 1700 to 1850 degrees Kelvin. Accordingly, it is apparent that the so-called field-emitter cathode described herein is characterized by both field emission and thermionic emission. This results in a more stable emission characteristic and a longer life than if the cathode were not heated and emission were based only on high-field forces. Such a cathode will be referred to herein as an electron emitter of the thermal-field-emission type.

Formed on the main shank of the element 10 shown in FIG. 1 is a material 16 that contains work-function-reducing constituents. These constituents comprise, for example, zirconium and oxygen.

An electron emitter of the type represented by the element 10 is strongly affected by thermodynamic driving forces. This is so because of the microscopic size of the emissive tip of the element 10 and because such an element is typically operated at relatively high temperatures at which rapid surface diffusion of the material of the tip occurs.

The thermodynamic driving forces affecting a thermal-field-emitter tip comprise:

1. Surface tension forces that tend to blunt the tip to minimize surface energy.
2. Electrostatic forces that induce stresses which tend to sharpen the tip.
3. Electromigration forces whose effects are small relative to forces 1 and 2.

In a conventional element of the thermal-field-emitter type, the angular distribution of current emitted from the tip thereof tended in practice to vary with time. In turn, these variations change the current density of the writing spot on a workpiece surface. Such variations are undesirable, if not unacceptable, in, for example, a high-precision lithography system.

Thus, designing a system including a thermal-field-emitter element to exhibit highly stable emission properties presents a considerable challenge. Among the factors that must be considered in designing a stable system of this type are: material composition and crystalline orientation of the emissive tip, overall shape of the tip and the electrostatic field forces acting on the tip. By careful selection and control of these factors, an advantageous system that comprises a high-brightness electron source is achieved. A specific illustrative such system that exhibits highly stable emission properties over a long period of time is described herein.

As shown in the enlarged view of FIG. 1, the extreme tip portion of the specific illustrative element 10 comprises several distinct regions. First, the end of the element 10 comprises a generally hemispherical region 18 having a radius r which in practice is typically at least approximately 0.5 micrometers. The region 18 includes at its apex a centrally located (100) flat portion 20. Electrons emitted from the portion 20 constitute the useful beam current of the emission system that includes the depicted cathode.

The tip portion shown in the enlarged view of FIG. 1 also comprises a generally cylindrical region 22. The tip portion further comprises a tapered portion 24 which serves as a transition region between the cylindrical region 22 and the aforementioned generally conical shape of the remainder of the tip portion.

In actual operation in an electron emission system, a tip portion shaped as shown in the enlarged view of FIG. 1 has been determined to be a particularly advantageous configuration. This is so because surface tension forces in the specific depicted structure are relatively small. Accordingly, the corresponding electrostatic field forces required to achieve long-term stability can also be relatively small. In turn, the required magnitude of these latter forces, which are opposite and must be at least equal to the surface tension forces acting on the tip portion of the structure, dictates the magnitudes of the voltages to be applied to the electrodes associated with the element 10. Thus, the magnitudes of these voltages are minimized in a system that includes a top portion shaped as shown in the enlarged view of FIG. 1. This simplifies, for example, the design of the power supply included in the system and minimizes the likelihood of arcing occurring in the system. Additionally, for a given maximum voltage that may be applied to the electrodes in a particular system design, the depicted tip shape permits the use of larger tips. This is generally desirable because larger tips are in practice more robust and less noisy.

Hence, when a tip portion of the advantageous type shown in the enlarged view of FIG. 1 is included in an electron emission system of the particular type specified below, changes in the electron emission characteristics of the tip portion arising from structural variations occur relatively slowly over a long period of time. As a result, a highly stable long-lived electron emission system suitable for high-precision applications such as electron beam lithography is thereby made possible.

Figure 2:
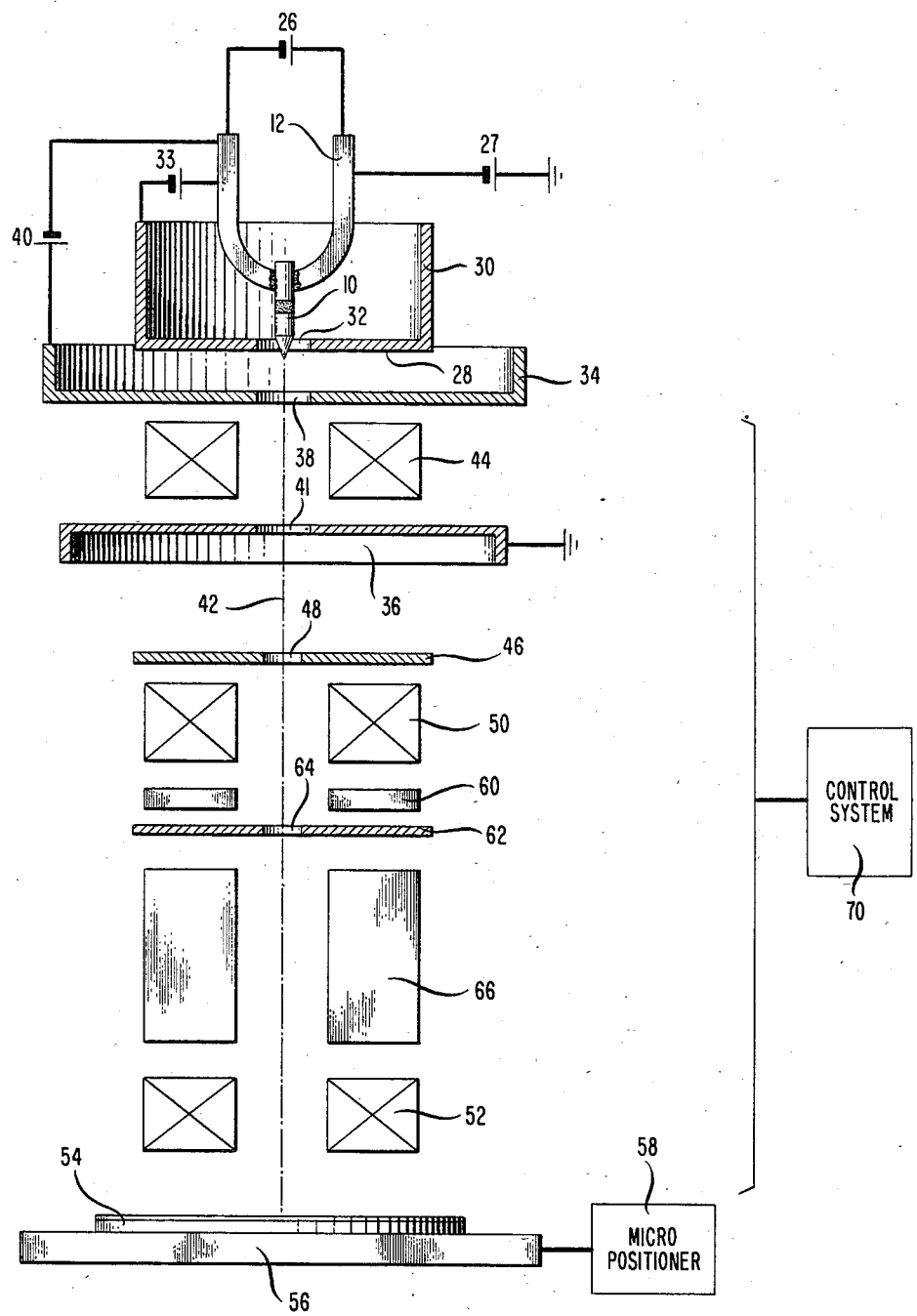
FIG. 2 is a schematic representation of an electron emission system, including the FIG. 1 element, that embodies applicants' inventive principles.

FIG. 2 is a schematic representation of a specific illustrative electron emission system made in accordance with the principles of the present invention. The path along which electrons are propagated in the system to impinge upon a target surface is contained in a conventional vacuum chamber (not shown) wherein a pressure of, for example, $10^{-7}$ Torr is maintained.

Advantageously, the source of electrons in the FIG. 2 system comprises the aforedescribed cathode element 10 shown in FIG. 1. A d-c source 26 is connected to the member 12 that supports the element 10. A relatively constant current supplied by the source 26 is effective in practice to heat the tip portion of the element 10 to a temperature in the range of 1700 to 1850 degrees Kelvin. Further, a source 27 maintains the element 10 at a potential of about −20 kilovolts with respect to a point of reference potential such as ground.

The flat emissive surface 20 (FIG. 1) at the apex of the hemispherical region 18 of the element 10 extend below (or downstream of) the bottom surface 28 (FIG. 2) of a cylindrically shaped biasing electrode 30. The electrode 30 includes a centrally located opening 32. Illustratively, the electrode 30, whose function is to reduce thermionic emission from the member 12 and shank portions of the element 10, is maintained by source 33 at a potential of about −500 volts relative to the element 10.

A two-anode configuration comprising electrodes 34 and 36 is included in the FIG. 2 system. The first electrode 34 constitutes an extractor anode including a centrally located opening 38. Illustratively, the extractor anode 34 is maintained by source 40 at a potential of about +10 to +12 kilovolts with respect to the element 10.

Electrons passing through the opening 38 in the extractor anode 34 of FIG. 2 are further accelerated by the second anode electrode 36. The electrode 36, which contains an aperture 41, is typically established at ground potential. Thus, the energy of the electron beam propagated along longitudinal axis 42 in FIG. 2 downstream of the accelerating anode 36 is 20 kilo-electron-volts. And, significantly, with this particular electrode configuration, the extraction voltage (determined by the value of the source 40) can be adjusted to establish a highly stable operating condition without altering a prespecified value of beam energy. Moreover, the current density of the beam delivered to a workpiece surface by the herein-considered arrangement can be subsequently varied, for example to meet specific resist material requirements, without having to change the value of the extraction voltage set by the source 40. Changing the value of the source 40 is undesirable because that would alter the predetermined electric field configuration that had been previously selected to achieve long-term stability.

In accordance with a feature of applicants' invention, once the beam-energy characteristic of a system of the type shown in FIG. 2 is specified and the overall system design customized in view thereof, the flexibility still exists (for example, after installing a new emissive element in the system) to vary the extraction voltage without altering the specified beam energy. In other words, the extraction voltage applied to an emissive element can be initially adjusted to achieve a stable operating condition without affecting the energy of the beam propagated in the system. As indicated herein, such a stable operating condition requires that the electrostatic field forces acting on the end of the emissive element be at least approximately equal to the surface tension forces acting thereon. Once this condition for long-term stability is achieved with respect to a particular emissive element, it is undesirable thereafter to alter the value of the extraction voltage.

The electric field configuration acting on the tip of the element 10 is determined primarily by the element 10 and the electrodes 30 and 34. In particular, the shape of the element 10, the spacing between the element 10 and the electrodes 30 and 34, and the potentials applied thereto are primarily determinative of this field configuration.

In accordance with a feature of applicants' invention, the electric field configuration acting on the tip of the element 10 remains in practice, once initially set, relatively invariant over extended periods of time. Illustratively, this field configuration is designed to produce forces that are opposite and at least approximately equal to the surface tension forces acting on the tip. And, as previously specified, the tip is advantageously uniquely shaped to exhibit relatively small surface tension forces. As a result, relatively small voltages applied to the electrodes associated with the tip are sufficient to achieve the required electrostatic forces. In operation, the shape of such a tip remains relatively fixed and provides a basis for a reliable system whose electron emission characteristics remain highly stable for thousands of hours of operation.

Interposed between the anodes 34 and 36 of the electron column schematically represented in FIG. 2 is an electromagnetic focusing lens 44. Additionally, the column includes a plate 46 having a beam-defining aperture 48 therethrough. After demagnification downstream by electromagnetic lenses 50 and 52, the electron beam propagated through the aperture 48 appears at the surface of a resist-coated workpiece 54 as a small-diameter writing spot. (In one illustrative system, the writing spot has a diameter of 0.125 micrometers.) As indicated in FIG. 2, the workpiece 54 is mounted on a table 56 whose movement is controlled by a micropositioner 58.

Also included in the column shown in FIG. 2 is a beam blanking unit that comprises an electrostatic deflector 60 and an associated beam blanking plate 62. During each successive interval of a writing sequence, the deflector 60 controls whether the beam propagating along the axis 42 passes through the aperture 64 in the plate 62 or is blocked from being propagated downstream by being deflected to impinge upon the plate 62. Advantageously, the propagating beam is controlled to have a cross-over point at the plate 62.

Movement of the electron beam on the surface of the workpiece 54 of FIG. 2 is controlled by a conventional deflection assembly 66. In turn, overall coordination of the various units schematically depicted in FIG. 2 is controlled by system 70.

As described above, an electron emission system designed with separate extraction and accelerating anodes 34 and 36, respectively, provides the flexibility required to achieve a stable-emission operating condition without changing the value of beam energy for which the overall system was designed. Moreover, once the extraction voltage is fixed with respect to a particular emissive element to achieve a stable operating condition, the herein-described system is adapted to vary the beam current density or dosage at the workpiece surface, for example to meet specific requirements of a resist material, without varying the extraction voltage. Stable operation of variable-dosage electron beam system is thereby insured.

In the FIG. 2 column, current density control is achieved by controlling the unit 44 to vary the beam diameter and thus the current density at the plate 46. The current density of the constant-diameter beam that propagates through the aperture 48 in the plate 46 is thereby varied. At the same time, the combined action of the units 44 and 50 is effective to maintain a beam cross-over point at the plate 62 even as the current density of the beam is varied.

Finally, it is to be undestood that the abovedescribed arrangements are only illustrative of the principles of the present invention. In accordance with these principles, numerous modifications and alternatives may be devised by those skilled in the art without departing from the spirit and scope of the invention. For example, the element 10 may be made from a material other than tungsten, for example from single-crystal molybdenum. Additionally, other known work-function-reducing materials such as hafnium may be utilized to enhance the emission characteristics of the element 10.

What is claimed is:

1. An emission system designed to provide a beam of electrons at a specified energy, said system comprising
an electron emitter of the thermal-field-emission type including a flat emissive end region,
and electrode means associated with said emitter for establishing with respect to the end region of said emitter, without changing said specified beam energy, electrostatic field forces that are opposite and at least approximately equal in value to the surface tension forces acting on said end region.

2. A system as in claim 1 wherein said electrode means comprises an anode assembly that includes
a first anode electrode spaced apart from the end region of said emitter
and a second anode electrode spaced apart from said first anode electrode.

3. A system as in claim 2 wherein said electrode means further includes a biasing electrode positioned between said emitter and said first anode electrode adjacent said end region.

4. A system as in claim 3 further including a source connected between said emitter and said biasing electrode for establishing said biasing electrode at a negative potential with respect to said emitter.

5. A system as in claim 4 further including a source connected to said emitter for establishing said emitter at a negative potential with respect to a point of reference potential such as ground.

6. A system as in claim 5 further including a source connected between said first anode electrode and said emitter for establishing said first anode electrode at a positive potential with respect to said emitter.

7. A system as in claim 6 further including means for connecting said second anode electrode to said point of reference potential.

8. A system as in claim 1 further including means for varying the current density of electrons propagated in said system to a workpiece surface without altering the electrostatic field forces acting on the end region of said emitter.

9. A system as in claim 8 wherein said varying means comprises
an apertured beam-diameter-defining plate spaced apart from said emitter,
an apertured beam-blanking plate spaced apart from said first-mentioned plate,
and a first magnetic lens positioned between said emitter and said first-mentioned plate and a second magnetic lens positioned between said plates for selectively varying the diameter of the electron beam directed at said beam-diameter-defining plate while insuring that a beam crossover occurs at said beam-blanking plate.

10. A system as in claim 1 wherein said emitter further comprises a generally curved end portion having said emissive end region approximately centrally positioned at the apex of said end portion.

11. A system as in claim 10 wherein the radius of said end portion is at least approximately 0.5 micrometers.

12. A system as in claim 11 wherein said emitter further comprises
a single-crystal elongated element having a main longitudinal axis perpendicular to the (100) plane of said element, said flat emissive region being formed at one end of said element,
a layer of work-function-reducing material on said element,
and means supporting the other end of said element.

13. A system as in claim 12 wherein said element comprises tungsten.

14. A system as in claim 13 wherein said material comprises zirconium and oxygen.

15. A system as in claim 14 wherein said material is disposed on the main shank portion of said element.

16. A system as in claim 15 wherein said supporting means comprises a U-shaped member comprising tungsten.

17. A system as in claim 16 further including a source connected to said U-shaped member for causing a current to flow therethrough thereby to heat the emissive end region of said element.

18. A system as in claim 1 wherein the tip of said emitter including said emissive end region is shaped to minimize surface tension forces.

19. A system as in claim 18 wherein the field forces established by said electrode means are opposite and approximately equal to the surface tension forces acting on said end region.

20. A system as in claim 19 wherein said heating means is adapted to heat the tip of said emitter to a temperature in the range 1700 to 1850 degress Kelvin.

21. A system as in claim 20 wherein said emitter further comprises
a single-crystal elongated element having a main longitudinal axis perpendicular to the (100) plane of said element, said flat emissive region being formed at one end of said element and constituting a (100) crystalline facet thereof,
a layer of work-function-reducing material on said element,
and means supporting the other end of said element.

22. A system as in claim 21 wherein said element comprises tungsten.

23. A system as in claim 22 wherein said material comprises zirconium and oxygen.

24. A system as in claim 23 wherein said element comprises, in order from said one end thereof to said supporting means;
a generally hemispherical end portion having at its apex said (100) flat emissive region,
a cylindrical portion,
a tapered portion,
and a main shank portion extending to said supporting means.

25. A system as in claim 24 wherein said generally hemispherical end portion has a radius of at least approximately 0.5 micrometers.

* * * * *